(12) United States Patent
Boor (10) Patent No.: US 8,890,615 B2
(45) Date of Patent: *Nov. 18, 2014

(54) BUFFERING APPARATUS AND METHOD (71) Applicant: Knowles Electronics, LLC, Itasca, IL (US)

(72) Inventor: Steven E. Boor, Plano, TX (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/084,107

(22) Filed: Nov. 19, 2013

(65) Prior Publication Data

US 2014/0070888 A1    Mar. 13, 2014

Related U.S. Application Data

(63) Continuation of application No. 13/223,436, filed on Sep. 1, 2011, now Pat. No. 8,604,880.

(60) Provisional application No. 61/379,588, filed on Sep. 2, 2010.

(51) Int. Cl.
   *H03F 3/16*     (2006.01)
   *H03F 1/56*     (2006.01)
   *H03F 3/50*     (2006.01)

(52) U.S. Cl.
   CPC .............. *H03F 1/56* (2013.01); *H03F 2200/54* (2013.01); *H03F 3/16* (2013.01); *H03F 3/505* (2013.01)
   USPC .......................................... 330/277; 330/295

(58) Field of Classification Search
   CPC ...................................... H03F 3/68; H03F 3/16
   USPC ......................... 330/277, 295, 124 R, 84, 126
   See application file for complete search history.

(56) References Cited

U.S. PATENT DOCUMENTS

| 3,946,327 | A |   | 3/1976 | Hsu |
| 4,675,561 | A | * | 6/1987 | Bowers ........................ 327/382 |
| 5,434,526 | A | * | 7/1995 | Tanigashira et al. .......... 327/389 |
| 5,559,892 | A |   | 9/1996 | Boor |

(Continued)

FOREIGN PATENT DOCUMENTS

| EP | 0228146 A1 | 7/1987 |
| WO | 95/08868 A1 | 3/1995 |

OTHER PUBLICATIONS

Related International Patent Application No. PCT/US2011/050165, International Search Report and Written Opinion of the International Searching Authority dated Feb. 29, 2012.

*Primary Examiner* — Henry Choe
(74) *Attorney, Agent, or Firm* — Fitch, Even, Tabin & Flannery LLP (57) ABSTRACT

The output impedance of an amplifier is substantially matched to an input impedance of a receiver using a buffer circuit. The buffer circuit includes a primary transistor and a secondary transistor. A first back gate terminal of the primary transistor is coupled to a second back gate terminal of the secondary transistor and the primary transistor is configured to have an output for the buffer circuit. An input signal is received from the amplifier at a gate terminal of the secondary transistor. The first back gate terminal of the primary transistor is responsively driven independently from the output of the buffer circuit to effectively adjust a transconductance of the primary transistor and substantially match an output impedance of the amplifier with an input impedance of the receiver.

4 Claims, 6 Drawing Sheets

(56) References Cited

U.S. PATENT DOCUMENTS

| | | |
|---|---|---|
| 5,861,779 A | 1/1999 | Boor |
| 6,518,817 B2 | 2/2003 | Anderson et al. |
| 6,753,699 B2 | 6/2004 | Stockstad |
| 7,106,567 B2 * | 9/2006 | Chloupek et al. ............ 361/91.1 |
| 8,049,555 B2 * | 11/2011 | Arnold et al. ................ 327/542 |
| 2004/0179702 A1 | 9/2004 | Boor |

* cited by examiner

BUFFERING APPARATUS AND METHOD

CROSS REFERENCE TO RELATED APPLICATION

This application is a continuation of prior U.S. application Ser. No. 13/223,436, now U.S. Pat. No. 8,604,880, entitled "Buffering Apparatus and Method," filed Sep. 1, 2011, which claims benefit under 35 U.S.C. §119(e) to U.S. Provisional Application No. 61/379,588, filed Sep. 2, 2010, the content of both applications is incorporated herein by reference in its entirety.

TECHNICAL FIELD

This application relates to acoustic systems and, more specifically, to buffering approaches used in these systems.

BACKGROUND OF THE INVENTION

Various types of microphone systems have been used in various applications through the years. Microphones in these systems typically receive acoustic energy and convert this acoustic energy into an electrical voltage. This voltage can be further processed for other applications or for other purposes. For example, in a hearing aid system the microphone may receive acoustic energy, and convert the acoustic energy to an electrical voltage. The voltage may be amplified or otherwise processed by an amplifier, or by other signal processing electronics circuitry, and then presented by a receiver as acoustic energy to a user or wearer of the hearing aid. To take another specific example, microphone systems in cellular phones typically receive sound energy, convert this energy into a voltage, and then this voltage can be further processed for use by other applications. Microphones are used in other applications and in other devices as well.

In such systems, the output impedance of the amplifier must be somehow matched to the input impedance of the receiver or other signal processing electronics circuitry, or signal degradation will occur. More specifically, the output impedance of the amplifier is usually high while the input impedance of the receiver is much lower and this mismatch causes signal attenuation unless corrected. Previous systems have often inserted a buffer to attempt to accomplish impedance matching.

Unfortunately, these previous approaches have suffered from several drawbacks. The buffers used in these systems typically used transistors. These transistors were electrically biased in such a way that the output resistance of the circuit was high and did not match the input impedance of the receiver. Because of the mismatch, distortion and degradation of the signal occurred. This was manifested by the end user or application not being able to recognize the signal.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide buffers and buffering approaches that achieve lower output impedance characteristics, which help to better match or approximately match the output impedances of amplifiers with the input impedances of receivers or of other signal processing electronics circuitry. In particular, the present buffering approaches include one or more primary transistors and one or more secondary transistors. The back-gate of the primary transistors is driven independently from the output terminal of the buffer circuit. In so doing, the transconductance of the primary transistor is increased thereby lowering the output resistance of the entire buffer circuit. As a result, signal degradation is significantly reduced or eliminated.

As mentioned, a secondary buffer circuit (e.g., using one or more secondary transistors that are preferably smaller in size and lower in power consumption than the primary transistors) is utilized to drive the back-gates of the one or more primary buffer transistors. The output of the second buffer circuit may also be used to drive other on-chip nodes. In one example, an on-chip node may be a node that is electrically connected to a metal shield used to guard out undesirable stray capacitances. Consequently, the secondary buffer circuit is not affected by off-chip loading. In some of these examples, the secondary buffer circuit shares the same input terminal as the primary buffer circuit.

Advantageously, the output resistance of the buffer circuit is reduced significantly for a given bias current, for instance, by approximately 30 percent as compared to approaches where one or more secondary buffer transistors are not used to drive the back-gates of one or more primary buffer transistors in the buffer circuit. Some previous approaches attempted to decrease the output resistance by increasing the biasing current. However, the present approaches are much more effective in reducing the output resistance than increasing the bias current alone. In fact, for the same output resistance, the total biasing current for the buffer circuit is significantly reduced using the present approaches.

As used herein, "transconductance" ($G_m$) refers to the ratio of the current change at the output port to the voltage change at the input port. For a MOS transistor device, the output port is the Drain-to-Source current ($I_{DS}$), while the input port is the Gate-to-Source voltage ($V_{GS}$). The transconductance may be a DC transconductance and/or an AC transconductance.

As used herein "multiples" refers to multiple physical electronic devices. For example, the primary transistors described herein may include multiples. In this case, more than one physical transistor is operated with respective device terminals electrically connected together. This arrangement may be represented schematically as an equivalent single transistor. Thus, it will be appreciated that any of the single transistors shown in the electrical diagrams presented herein may, in fact, include multiple physical elements that are connected electrically in parallel.

In many of the embodiments described herein, a buffer includes a first or primary transistor and a second or secondary transistor, for example, a metal oxide semiconductor (MOS) transistor or complimentary metal oxide semiconductor (CMOS) transistor. Other examples of transistor types are possible. The primary and secondary transistors each include a source terminal, a gate terminal, a drain terminal, and a back-gate terminal (which is alternatively called a bulk terminal).

In others of these embodiments, a buffer circuit is configured to substantially match an output impedance of an amplifier to an input impedance of a receiver. The circuit includes a primary transistor and a secondary transistor. The primary transistor has a first back gate terminal, a first source terminal, a first gate terminal, and a first drain terminal. The first source terminal is an output of the buffer circuit that is coupled to the receiver.

The secondary transistor has a second back gate terminal, a second drain terminal, a second source terminal, and a second gate terminal. The secondary transistor is configured to receive an input signal from the amplifier at the second gate terminal. The first back gate terminal of the primary transistor is coupled to the second back gate terminal of the secondary transistor so that the input signal drives the first back gate terminal independently from the output of the buffer circuit and responsively adjusts the transconductance of the primary transistor.

In other aspects, the secondary transistor is further coupled to other nodes that are separate from the buffer circuit. In still other aspects, a high pass filter is coupled between the first back gate terminal and the second back gate terminal. The high pass filter may include at least one capacitor and at least one resistor.

In still other aspects, the secondary transistor is smaller in size and lower in power consumption as compared to the primary transistor. The primary transistor and the secondary transistor may be a CMOS device or a MOS device. Other examples are possible.

In other aspects, the first gate of the primary transistor is driven by the input signal received from the amplifier. In other aspects, the first gate of the primary transistor is electrically coupled to the first back gate of the primary transistor.

In others of these embodiments, the output impedance of an amplifier is substantially matched to an input impedance of a receiver using a buffer circuit. The buffer circuit includes a primary transistor and a secondary transistor. A first back gate terminal of the primary transistor is coupled to a second back gate terminal of the secondary transistor and the primary transistor is configured to have an output for the buffer circuit. An input signal is received from the amplifier at a gate terminal of the secondary transistor. The first back gate terminal of the primary transistor is responsively driven independently from the output of the buffer circuit to effectively adjust a transconductance of the primary transistor and substantially match an output impedance of the amplifier with an input impedance of the receiver.

Figure 1:
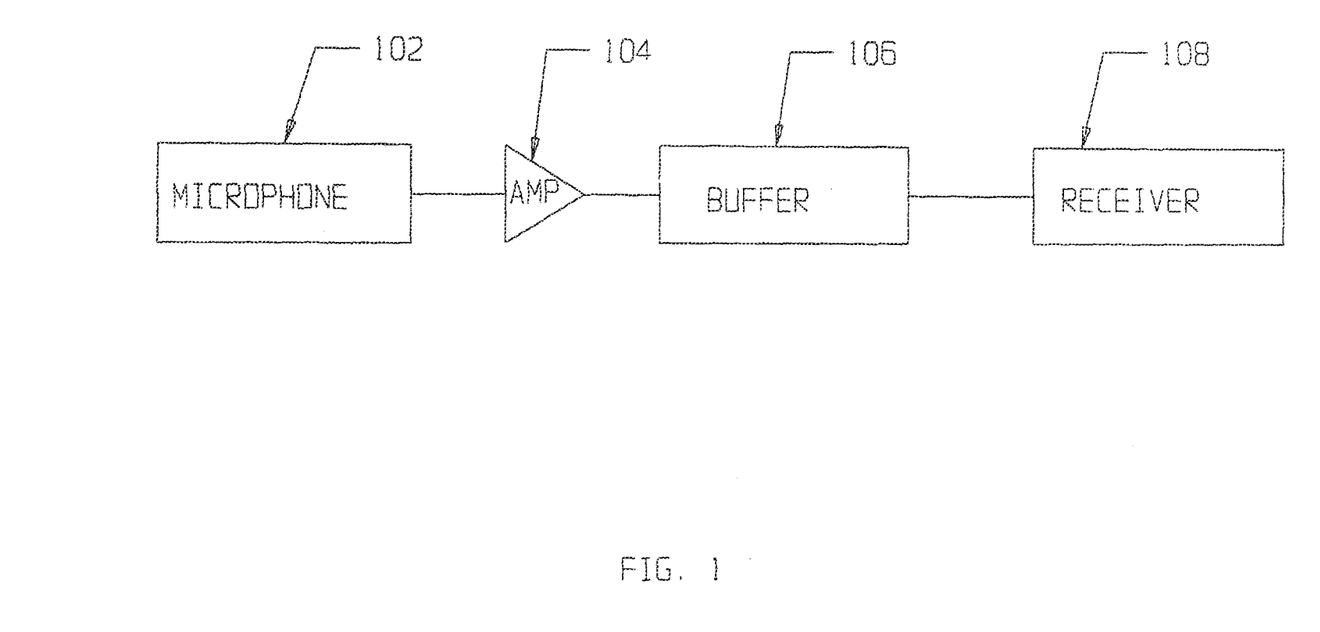
FIG. 1 comprises a block diagram of an acoustic system according to various embodiments of the present invention.

Referring now to FIG. 1, one example of an audio system 100 includes a microphone 102, an amplifier 104, a buffer 106, and a receiver 108. Power is supplied to these elements, for example, from a battery (not shown) or some other energy source.

The microphone 102 may be any microphone the receives acoustic energy and converts this energy to an electrical signal. For example, the microphone 102 may be an electret microphone such as the commercially available FG3629 microphone, sold by Knowles Electronics of Itasca, Ill. Such an electret microphone may include a charged plate (not shown) which is coupled to the gate of an FET (also not shown).

The amplifier 104 amplifier amplifies the electrical signal for use by the receiver 16. For instance, the amplifier 104 may amplify signals from 6 to 20 db. Other amplification values are possible.

The receiver 108 may be any receiver device such as a speaker. The receiver 108 converts the signal amplified by the amplifier 104 to an amplified sound, for example, for presentation to a user (e.g., the wearer of a hearing aid or some electrical processing application). Other examples of receivers and receiver functions are possible.

The buffer 106 matches (or approximately matches) the relatively high output impedance of the amplifier 104 to relatively low input impedance of the receiver 108 to prevent gain attenuation from occurring to the signal presented to the receiver 108. As mentioned, gain attenuation degrades the received signal quality and/or signal level. The buffer 106 includes a primary buffer transistor and a secondary buffer transistor. The back-gate of the primary buffer transistor is driven independently from the output terminal of the buffer. In so doing, the transconductance of the primary buffer transistor is increased thereby lowering the output resistance or impedance of the circuit. The output resistance ($R_{OUT}$) as used herein refers to the equivalent electrical resistance driving the terminal $V_{OUT}$.

In one example of the operation of the system of FIG. 1, acoustic energy is received at the microphone 102. For example, this acoustic energy may be in the form of human speech, music, or any other sound or combination of sounds. The microphone 102 converts the energy into an electrical signal, which is amplified by the amplifier 104. The buffer 106 (including at least one primary transistor and at least one secondary transistor) matches (or approximately matches) the output impedance of the amplifier 104 with the input impedance of the receiver 108. Advantageously, the output resistance of the buffer 106 is reduced significantly, for instance, by approximately 30 percent as compared to approaches where the secondary buffer transistors are not used in the buffer 106. In so doing, gain attenuation is significantly reduced or eliminated and the quality of the signal presented to the receiver 108 is maintained. The receiver 108 converts the electrical signal to a sound signal for presentation to a user.

As described elsewhere herein, DC biasing of the primary transistor in the buffer circuit 106 may be needed to prevent attenuation or signal distortion from occurring. The DC bias of the source terminal of the primary transistor in the buffer 106 maintains a voltage in the approximate middle of the power supply range. In approaches where a filter is used to couple primary and secondary transistors, the source terminal biasing voltage may drop from, for example, 0.5 volts to approximately 0.25 volts. This drop in the source terminal biasing voltage may result in the voltage waveform being clipped or otherwise attenuated or distorted for moderately large signals. In some examples, additional physical primary transistors are connected in parallel (i.e., the multiple of primary transistors to secondary transistors is increased) to re-optimize the DC bias voltage of the source terminal closer to the middle of the power supply range, which appreciably helps to significantly reduce or eliminate any clipping, distortion, or signal attenuation.

Figure 2:
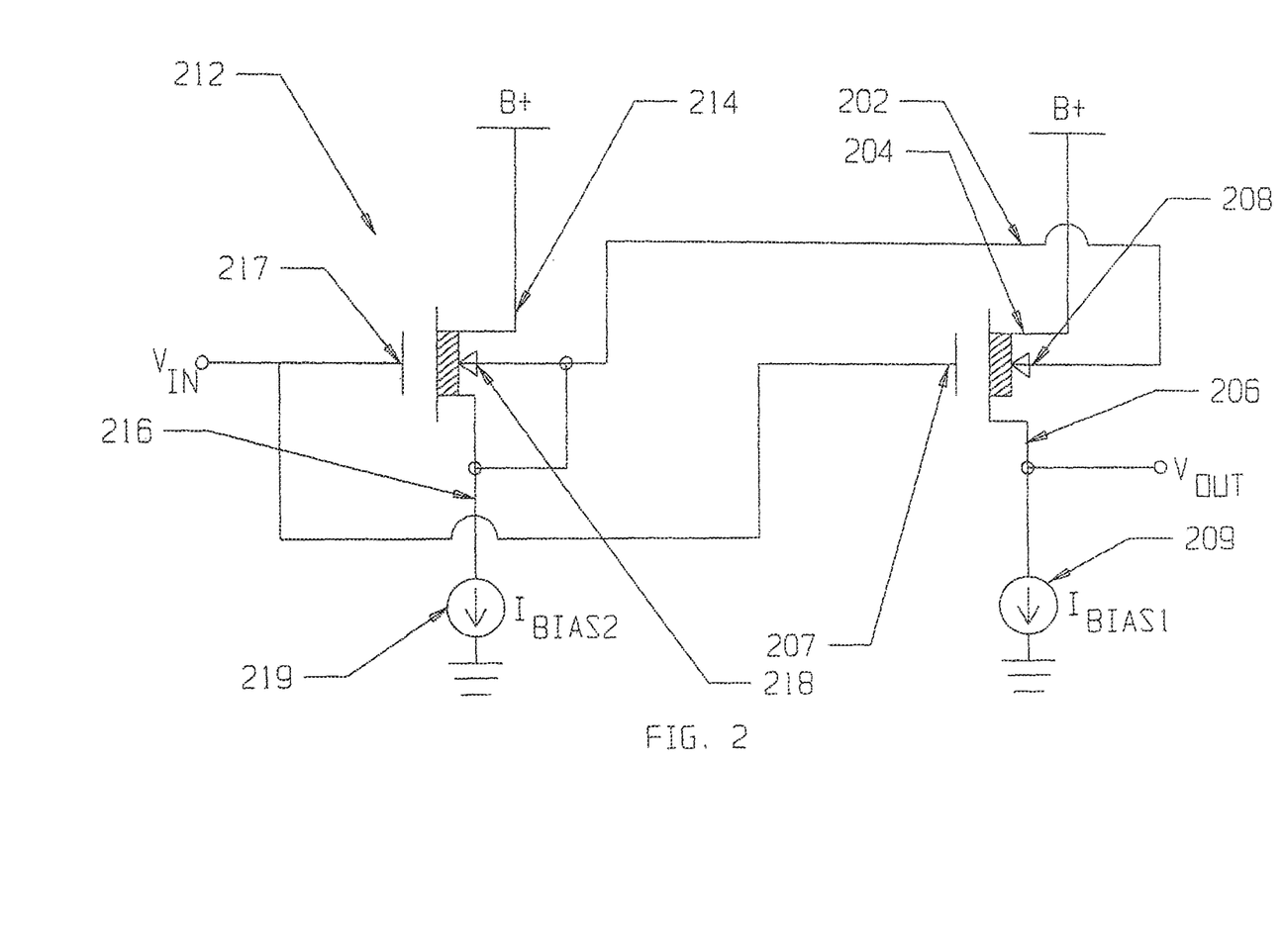
FIG. 2 comprises a circuit diagram of a buffer according to various embodiments of the present invention.

Referring now to FIG. 2, one example of a buffer circuit 200 (e.g., the buffer circuit 106 of FIG. 1) is described. The buffer circuit 200 includes a primary transistor 202. The primary transistor 202 includes a drain terminal 204, a source terminal 206, a gate terminal 207, and a back-gate terminal 208. The primary transistor may be a MOS or CMOS device. Other examples of devices are possible.

The buffer circuit 200 also includes a secondary transistor 212. The secondary transistor 212 includes a drain terminal 214, a source terminal 216, a gate terminal 217, and a back-gate terminal 218. The secondary transistor 212 may also be a MOS or CMOS device. Other examples of devices are possible.

As shown in FIG. 2, a battery current source B+ is coupled to the drain terminals 204 and 214. A first biasing current source 209 IBIAS1 is coupled to the source terminal 206. A second biasing current source 219 IBIAS2 is coupled to the source terminal 216. The purpose of the biasing current sources 209 and 219 is to set the DC current flow such that the source terminal DC voltage bias points and the gain of the buffer circuit 200 are optimized. In some examples, the current sources 209 and 219 may be resistances. Other electrical elements may also be utilized. The primary biasing current may be in the range of 10 to 20 micro amps while the secondary biasing current may be in one-third to one-fifth of the value of the primary biasing current. Other current ranges may also be used.

The back-gate 208 of the primary transistor 202 is coupled to the back-gate 218 of the secondary transistor 212. In other examples and as described elsewhere herein, a high pass filter (e.g., using capacitor and resistor elements) is coupled between the back-gates 208 and 218. In the circuit 200, the source 216 and the back-gate 218 of the secondary transistor 212 are coupled together. It is also possible to connect the back-gate 218 of the secondary transistor 212 to the output node of a high pass filter network.

The secondary transistor 212 in one aspect is smaller in size and lower in power consumption as compared to the primary buffer transistor. In this respect, the physical area of the chip (or other device) occupied by the secondary transistor is less than the physical area of the chip occupied by the primary transistor. The output of the secondary transistor 212 at the source node 216 may be used to drive other on-chip nodes. In one example, an on-chip node may be a node that is electrically connected to a metal shield. Other examples are possible. In this example, the secondary transistor 212 shares the same input as the primary transistor 202. In other words, the input signal is the same at the gates 207 and 217.

In operation, the back-gate 208 of the primary transistor 202 is driven independently of the output Vout by the secondary transistor 212. As a result, the transconductance of the primary transistor 202 is increased. This increase in the transconductance of the primary transistor 202 results in a decrease in the output resistance $R_{OUT}$ of the circuit shown in FIG. 2.

To take one example, the arrangement of the circuit of FIG. 2 results in the output resistance of the primary buffer transistor 202 being reduced significantly, for instance by approximately 30 percent for a given DC bias current IBIAS1 as compared to approaches where the secondary transistor 212 is not used. Consequently, gain attenuation of the signal going from the amplifier to the receiver is significantly reduced or eliminated and the quality of this signal is maintained for presentation to a receiver or other signal processing electronics circuitry.

Figure 3:
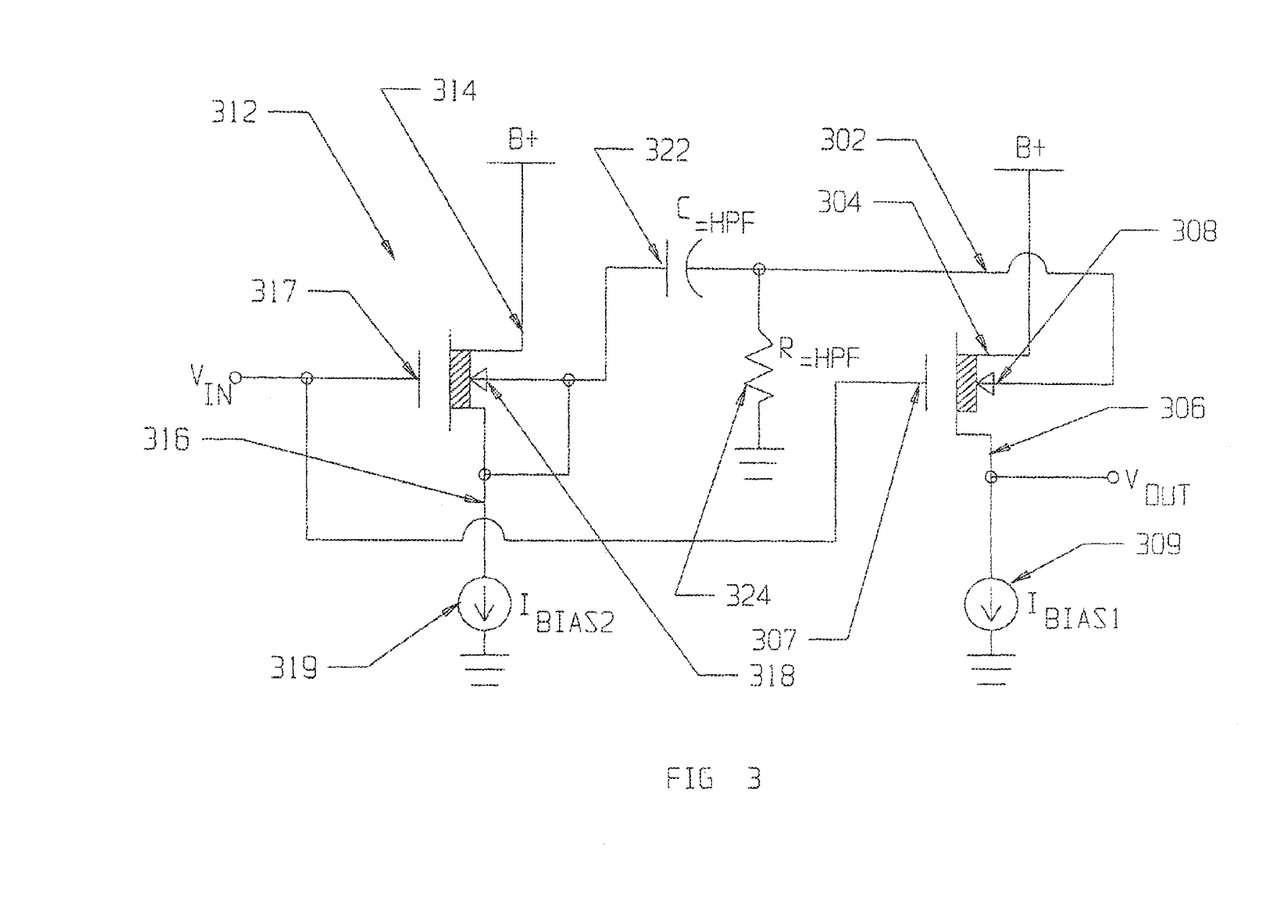
FIG. 3 comprises a circuit diagram of a buffer that utilizes a filter according to various embodiments of the present invention.

Referring now to FIG. 3, another example of a buffer circuit 300 (e.g., buffer 106 in FIG. 1) is described. The buffer circuit 300 includes a primary transistor 302. The primary transistor 302 includes a drain terminal 304, a source terminal 306, a gate terminal 307, and a back-gate terminal 308. The primary transistor may be a MOS or CMOS device. Other examples of devices are possible.

The buffer 300 also includes a secondary transistor 312. The secondary transistor 312 includes a drain terminal 314, a source terminal 316, a gate terminal 317, and a back-gate terminal 318. The secondary transistor 312 may also be a MOS or CMOS device. Other examples of devices are possible.

As shown in FIG. 3, a battery current source B+ is coupled to the drain terminals 304 and 314. A first biasing current source 309 IBIAS1 is coupled to the source terminal 306. A second biasing current source 319 IBIAS2 is coupled to the source terminal 316. The purpose of the biasing current sources is to set the DC current flow such that the gain and DC voltage operating point of the source terminals of the buffer circuit 300 are optimized. In some examples, the current sources 309 and 319 may be resistances. Other electrical elements may also be utilized. The primary biasing current may be in the range of 10 to 20 micro amps while the secondary biasing current may be in one-third to one-fifth of the value of the primary biasing current. Other current ranges may also be used.

A capacitor 322 and a resistor 324 form a high pass filter network and couple the back-gate 318 of the secondary transistor 312 to the back-gate 308 of the primary transistor 302. In one example, the resistor 324 has a value of approximately 1 mega ohms and the capacitor 322 has a value of approximately 1.6 nano farads. Other values for these components are possible. The values may also be changed based upon chip size considerations. For example, the resistance may be increased allowing the capacitance to be decreased thereby saving chip space (allowing a smaller chip to be used) due to the generally larger physical sizes of capacitors as compared to resistors. Other types of filter networks are also possible, e.g., the use of a bandpass filter network, as long as the DC voltage biasing of the back-gate 308 of the primary transistor 302 is optimized. Alternate connectivity of the back-gate 318 of the secondary transistor 312 is also possible, e.g., its connection in common with the back-gate 308 of the primary transistor 302 to the output of the high pass filter network (i.e., the common node connecting capacitor 322 and the resistor 324).

The device multiple (i.e., the number of primary transistors as compared to secondary transistors) may be required to be increased, in order to maintain optimal source terminal voltage biasing for the buffer 300 to achieve maximum signal swing without clipping or distortion. The $R_{OUT}$ for this example is smaller in value to the example of FIG. 2, which is often preferred. However, this example may also occupy appreciably more chip area than the example of FIG. 2 when the device multiple is increased.

More specifically, a larger multiple for the primary transistor 302 may be needed to keep the $V_{OUT}$ bias point close to a mid-supply value (e.g., approximately 0.5 volts). The larger multiple increases the transconductance and further lowers $R_{OUT}$. If the multiple for the transistor 302 is not increased, then the DC bias voltage for $V_{OUT}$ shifts undesirably downward. $V_B$ (back-gate voltage) of transistor 302 is approximately 0 volts (determined by the resistor 324) which causes the $V_{BS}$ (back-gate-to-source voltage) of transistor 302 to go negative, which shifts the device threshold voltage positive and thus $V_{OUT}$ drops closer to approximately 0 volts (i.e., to an undesirable level far below the optimal mid-supply DC bias point). As the multiple for the transistor 302 is increased, the $V_{GS}$ (gate to source) of the transistor 302 must become more negative which in turn shifts the DC bias voltage for $V_{OUT}$ to a more positive value (and back to the optimum mid-supply voltage needed for maximum signal swing without clipping and distortion).

Figure 4:
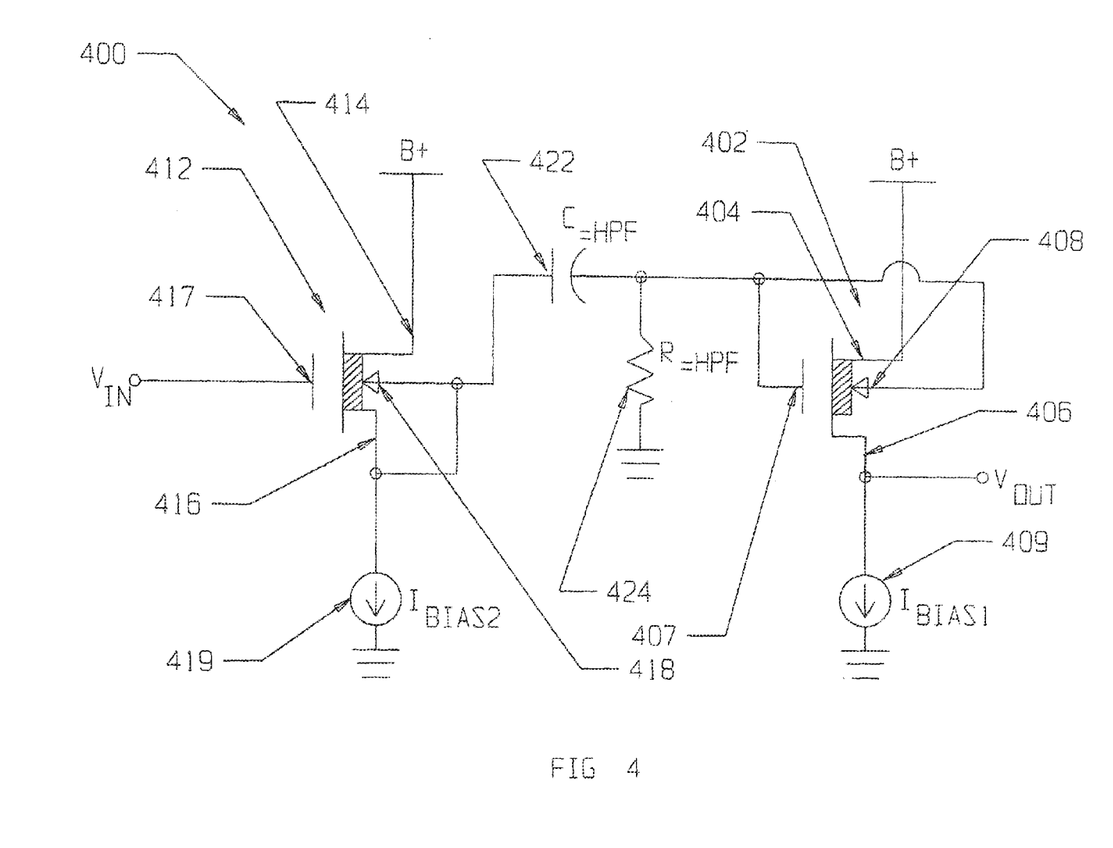
FIG. 4 comprises a circuit diagram of a buffer that utilizes a filter according to various embodiments of the present invention.

Referring now to FIG. 4, still another example of a buffer circuit 400 is described. The buffer circuit 400 includes a primary transistor 402. The primary transistor 402 includes a drain terminal 404, a source terminal 406, a gate terminal 407, and a back-gate terminal 408. The primary transistor may be a MOS or CMOS device. Other examples of devices are possible.

The buffer 400 also includes a secondary transistor 412. The secondary transistor 412 includes a drain terminal 414, a source terminal 416, a gate terminal 417, and a back-gate terminal 418. The secondary transistor 412 may also be a MOS or CMOS device. Other examples of devices are possible.

As shown in FIG. 4, a battery current source B+ is coupled to the drain terminals 404 and 414. A first biasing current source 409 IBIAS1 is coupled to the source terminal 406. A second biasing current source 419 IBIAS2 is coupled to the source terminal 416. The purpose of the biasing current sources is to set the DC current flow such that the source terminal DC voltage bias points and the gain of the buffer circuit 400 are optimized. In some examples, the current sources 409 and 419 may be resistances. Other electrical elements may also be utilized. The primary biasing current may be in the range of 10 to 20 micro amps while the secondary biasing current may be in one-third to one-fifth of the value of the primary biasing current. Other current ranges may also be used.

A capacitor 422 and a resistor 424 form a high pass filter and couple the back-gate 418 to the back-gate 408 and the gate 407. In one example, the resistor 424 has a value of approximately 1 mega ohms and the capacitor 422 has a value of approximately 1.6 nano farads. Other values for these components are possible. The values may also be changed based upon chip size considerations. For example, the resistance may be increased allowing the capacitance to be decreased thereby saving chip space (allowing a smaller chip to be used) due to the generally larger physical sizes of capacitors as compared to resistors.

As compared to the example buffer circuit of FIG. 3, the example buffer circuit of FIG. 4 behaves more as a two-stage device with the gain continuing to drop off at lower frequencies. In contrast, the gain of the circuit of FIG. 3 will level off at lower frequencies.

The device multiple of buffer 400 may be required to increase, in order to maintain optimal source terminal voltage biasing for the buffer to achieve maximum signal swing without clipping or distortion. The $R_{OUT}$ for this example is smaller in value to the example of FIG. 3. However, this example may also occupy appreciably more chip area than the example of FIG. 3 when the device multiple is increased.

More specifically, a larger multiple for the primary transistor 402 may be needed to keep the $V_{OUT}$ bias point close to a mid-supply value (e.g., approximately 0.5 volts). The larger multiple increases the transconductance and further lowers $R_{OUT}$. If the multiple for the transistor 402 is not increased, then the DC bias voltage for $V_{OUT}$ shifts downward. $V_B$ (back-gate voltage) of transistor 402 is approximately 0 volts (determined by the resistor 424) which causes the $V_{BS}$ (back-gate-to-source voltage) of transistor 402 to go negative, which shifts the device threshold voltage positive and thus $V_{OUT}$ drops closer to approximately 0.25 volts (i.e., to an undesirable level far below the mid-supply DC bias point). As the multiple for the transistor 402 is increased, the $V_{GS}$ (gate to source voltage) of the transistor 402 must become more negative which in turn shifts the DC bias voltage for $V_{OUT}$ to a more positive value (and back to the optimum mid-supply voltage needed for maximum signal swing without clipping and distortion).

Figure 5:
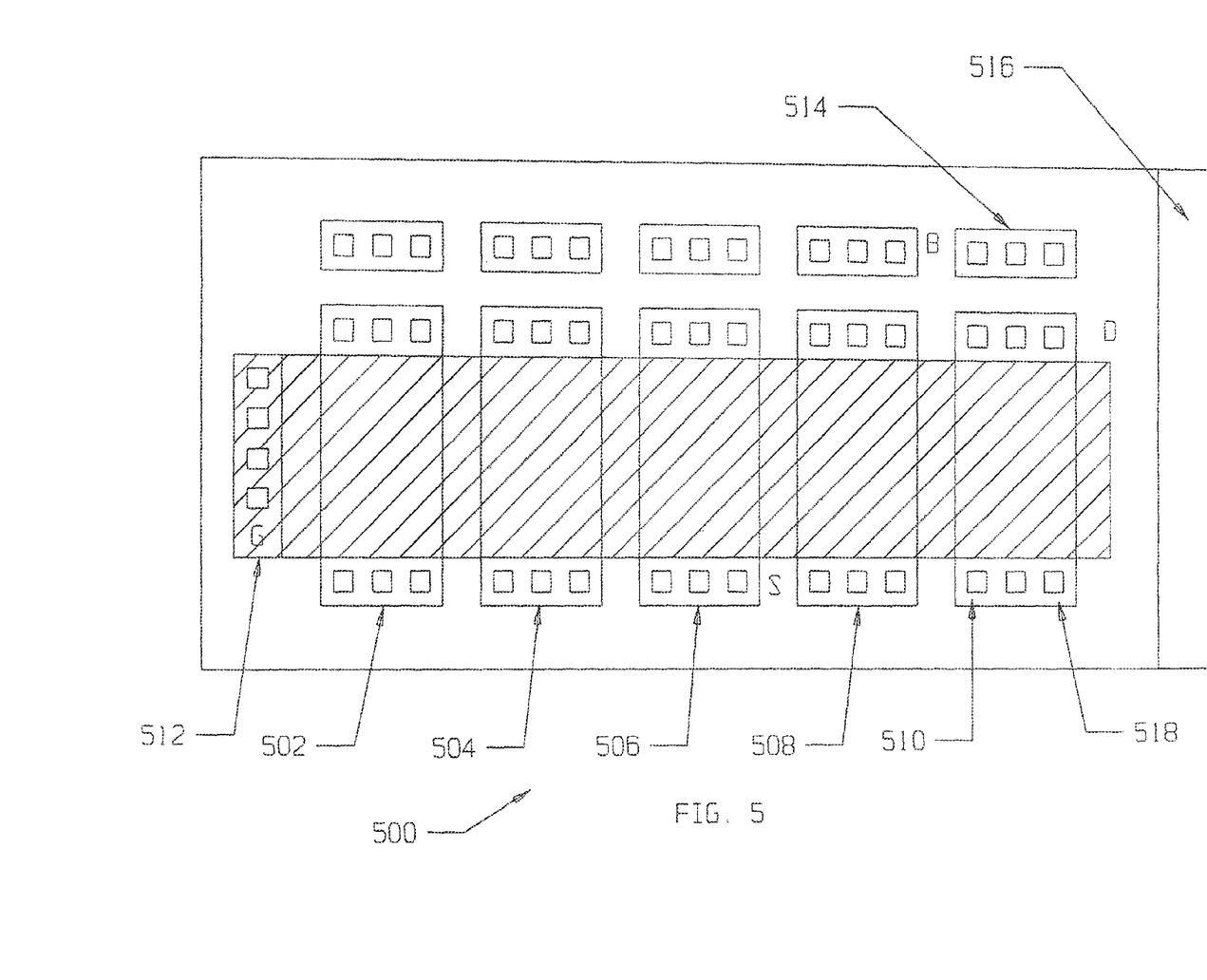
FIG. 5 comprises a chip lay-out of a section of a buffer showing transistor multiples according to various embodiments of the present invention.

Referring now to FIG. 5, one example of a chip layout for the approaches described herein is described. FIG. 5 shows one grouping of primary transistors laid out on a single chip 500. It will be appreciated that another chip may include the secondary transistors and/or a single chip 500 may include both the primary and secondary transistors as well as their interconnections (including any filtering elements).

As shown in FIG. 5, the chip 500 includes transistors 502, 504, 506, 508, and 510. The transistors 502, 504, 506, 508, and 510 are electrically connected in parallel. Each has a gate terminal 512, a back-gate terminal 514, a drain terminal 516, and a source terminal 518. The electrical interconnections are not shown in FIG. 5.

As mentioned, this example shows the primary transistor and it will be appreciated that the secondary transistor can be disposed on a separate chip and electrically connected to the primary transistor.

It will be appreciated that these buffer approaches allow scaling to be easily accomplished. For example, the primary transistor(s) can be selected to provide a particular output resistance and then the number of secondary transistor(s) can be scaled down in amount from the number of primary transistors. This scaling provides a system that does not waste electrical current or chip area and it allows for easy selection and adjustment of $R_{OUT}$.

It will be understood that the ratio of physical primary transistors to secondary transistors (i.e., the correspondence) may be adjusted to be any number that is selected so as to economize current, chip area, provide a particular $V_{OUT}$, or provide a particular $R_{OUT}$. For example, there may be a 1:1 correspondence, a 4:1 correspondence, or a 10:1 correspondence to mention a few examples.

Figure 6:
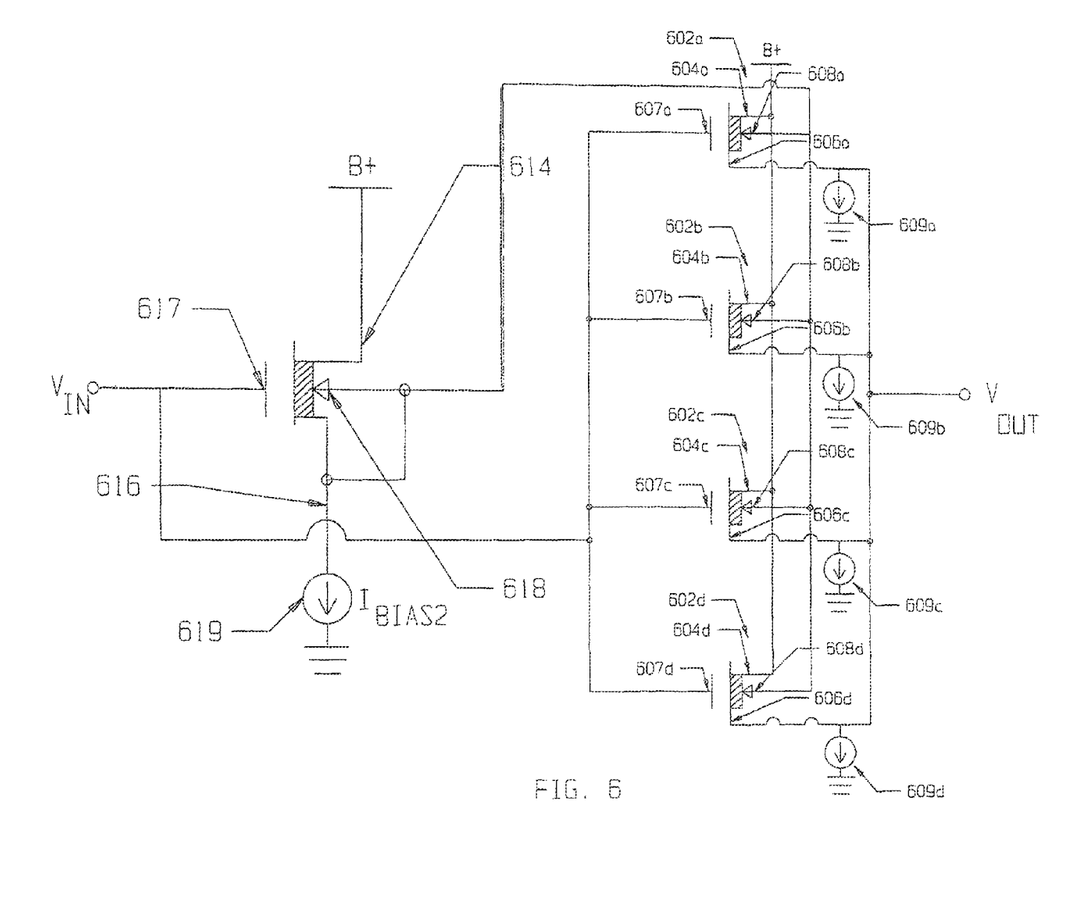
FIG. 6 comprises an electrical circuit diagram showing multiples according to various embodiments of the present invention.

Referring now to FIG. 6, one example of an electrical schematic that shows all physical primary and secondary transistors is described. For illustrative purposes, all physical transistors are shown in this example, which follows the approach described with respect to FIG. 2. However, it will be appreciated that the examples of FIGS. 3 and 4 may also include multiples.

The buffer circuit 600 is described includes primary transistors 602a, 602b, 602c, and 602d. The primary transistors 602a, 602b, 602c, and 602d include drain terminals 604a, 604b, 604c, and 604d; source terminals 606a, 606b, 606c, and 606d; gate terminals 607a, 607b, 607c, and 607d; and back-gate terminal 608a, 608b, 608c, and 608d. The primary transistors 602a, 602b, 602c, and 602d may be MOS or CMOS devices. Other examples of devices are possible. The primary transistors 602a, 602b, 602c, and 602d are connected electrically in parallel.

The buffer 600 also includes a secondary transistor 612. The secondary transistor 612 includes a drain terminal 614, a source terminal 616, a gate terminal 617, and a back-gate terminal 618. The secondary transistor 612 may also be a MOS or CMOS device. Other devices examples are possible.

Although only a single secondary transistor is shown in FIG. 6, it will be appreciated that any multiple number of secondary transistors may be used.

As shown in FIG. 6, a battery current source B+ is coupled to the drain terminals 604 and 614. A first biasing current source 609 is coupled to the source terminal 606. A second biasing current source 619 is coupled to the source terminal 616.

The operation of the circuit of FIG. 6 is the same as that of the circuit of FIG. 2 and will not be repeated again here.

Thus, the present approaches provide buffers that substantially match output impedances of amplifiers with the input impedances of receivers or other signal processing electronics circuitry. In particular, buffers include one or more primary transistors and one or more secondary transistors. The back-gate terminal of the primary transistors is driven independently from the output terminal of the buffer circuit. In so doing, the transconductance of the primary transistors is increased thereby lowering the output resistance of the entire buffer circuit. Consequently, signal degradation is significantly reduced or eliminated.

While the present disclosure is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An analog buffer circuit configured to substantially match an output impedance of an amplifier with an input impedance of a receiver, the circuit comprising:
   a primary transistor, the primary transistor having a first back gate terminal, a first source terminal, a first gate terminal, and a first drain terminal, the first source terminal being an output of the buffer circuit, the output being coupled to the receiver;
   a secondary transistor, the secondary transistor having a second back gate terminal, a second drain terminal, a second source terminal, and a second gate terminal, the secondary transistor configured to receive an input signal from the amplifier at the second gate terminal;
   wherein the first back gate terminal of the primary transistor is coupled to the second back gate terminal of the secondary transistor so that the second source terminal of the secondary transistor drives the first back gate terminal and responsively adjusts the transconductance of the primary transistor;
   wherein the second back gate terminal is coupled to the second source terminal and the first back gate terminal is not coupled to the first drain terminal;
   and further comprising a filter coupled between the first back gate terminal and the second back gate terminal.

2. The analog buffer circuit of claim 1 wherein the filter is a bandpass filter.

3. A method of matching the output impedance of an amplifier to an input impedance of an analog-to-digital converter or a next stage analog device by using an analog buffer circuit, the buffer circuit including a primary transistor and a secondary transistor, a first back gate terminal of the primary transistor being coupled to a second back gate terminal of the secondary transistor, the primary transistor configured to provide an output for the buffer circuit, the primary transistor further including a first source terminal, a first gate terminal, and a first drain terminal, the secondary transistor including a second drain terminal, a second source terminal, and a second gate terminal, the method comprising:
   receiving an input signal from the amplifier at a gate terminal of the secondary transistor;
   responsively driving the first back gate terminal with the second source terminal of the secondary transistor, the driving being effective to adjust a transconductance of the primary transistor and substantially match an output impedance of the amplifier with an input impedance of the analog-to-digital converter or next stage analog device;
   wherein the second back gate terminal is coupled to the second source terminal and the first back gate terminal is not coupled to the first drain terminal;
   and further comprising filtering signals passed between the second back gate and the first back gate using a filter.

4. The method of claim 3 wherein the filter is a bandpass filter.

* * * * *